United States Patent
Miyake et al.

(10) Patent No.: US 10,236,243 B2
(45) Date of Patent: Mar. 19, 2019

(54) ELECTRONIC COMPONENT, ELECTRONIC MODULE, MANUFACTURING METHOD THEREFOR, AND ELECTRONIC APPARATUS

(71) Applicant: CANON KABUSHIKI KAISHA, Tokyo (JP)

(72) Inventors: Takashi Miyake, Tokyo (JP); Masamichi Masuda, Tachikawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 257 days.

(21) Appl. No.: 14/931,148

(22) Filed: Nov. 3, 2015

(65) Prior Publication Data
US 2016/0135301 A1    May 12, 2016

(30) Foreign Application Priority Data
Nov. 6, 2014 (JP) ................. 2014-226086

(51) Int. Cl.
*H01L 23/13* (2006.01)
*H05K 1/14* (2006.01)
(Continued)

(52) U.S. Cl.
CPC ...... *H01L 23/49838* (2013.01); *H01L 21/565* (2013.01); *H01L 23/49805* (2013.01);
(Continued)

(58) Field of Classification Search
CPC ........... H01L 2224/97; H01L 2924/181; H01L 23/49838; H01L 21/565; H01L 23/49805;
(Continued)

(56) References Cited

U.S. PATENT DOCUMENTS

| 2001/0033474 A1 | 10/2001 | Sakai | |
|---|---|---|---|
| 2011/0133321 A1* | 6/2011 | Ihara | H01G 2/065 257/676 |

(Continued)

FOREIGN PATENT DOCUMENTS

| CN | 101295694 A | 10/2008 |
|---|---|---|
| CN | 101436571 A | 5/2009 |

(Continued)

*Primary Examiner* — Michael P McFadden
(74) *Attorney, Agent, or Firm* — Canon U.S.A., Inc. IP Division (57) ABSTRACT

An electronic component includes an electronic device, a mounting member for mounting the electronic device and having a first connecting portion electrically coupled to the electronic device and a second connecting portion, and a sealing member covering the electronic device and the first connecting portion. The mounting member includes a substrate having a mounting surface mounting the electronic device, a first conductive layer disposed on the mounting surface, and a second conductive layer. The first conductive layer includes a first conductive pattern having the first connecting portion and a second conductive pattern having the second connecting portion and spaced apart from the first conductive pattern in a second direction along the mounting surface. The second conductive pattern is connected to the first conductive pattern through a third conductive pattern included in the second conductive layer. The sealing member does not cover the second conductive pattern.

15 Claims, 6 Drawing Sheets

(51) Int. Cl.
*H05K 3/38* (2006.01)
*H01L 23/31* (2006.01)
*H01L 23/498* (2006.01)
*H01L 21/56* (2006.01)
*H05K 3/00* (2006.01)
*H05K 3/28* (2006.01)

(52) U.S. Cl.
CPC ........ *H01L 23/49822* (2013.01); *H01L 23/13* (2013.01); *H01L 23/3121* (2013.01); *H01L 2224/48091* (2013.01); *H01L 2224/97* (2013.01); *H01L 2924/181* (2013.01); *H05K 1/141* (2013.01); *H05K 3/0052* (2013.01); *H05K 3/284* (2013.01); *H05K 2201/049* (2013.01); *H05K 2201/10378* (2013.01)

(58) Field of Classification Search
CPC ............... H01L 23/49822; H01L 23/13; H01L 23/3121; H01L 224/48091; H05K 1/141; H05K 3/0062; H05K 3/284; H05K 2201/049; H05K 2201/10378
USPC .......................................................... 361/760
See application file for complete search history.

(56) References Cited

U.S. PATENT DOCUMENTS

2013/0143045 A1\* 6/2013 Zhou .................. H04M 1/0283
428/413
2015/0256127 A1\* 9/2015 Takebayashi ........ H03H 9/0542
331/68

FOREIGN PATENT DOCUMENTS

| CN | 101675518 A | 3/2010 |
| CN | 102130113 A | 7/2011 |
| CN | 102956587 A | 3/2013 |
| CN | 104916645 A | 9/2015 |
| JP | H11-297876 A | 10/1999 |
| JP | 2000059013 A | 2/2000 |
| JP | 2002-164479 A | 6/2002 |
| JP | 2005-294343 A | 10/2005 |
| JP | 2007-199049 A | 8/2007 |
| JP | 2008-277325 A | 11/2008 |
| JP | 2009-503888 A | 1/2009 |
| JP | 2009-188086 A | 8/2009 |

\* cited by examiner

FIG. 6C

ELECTRONIC COMPONENT, ELECTRONIC MODULE, MANUFACTURING METHOD THEREFOR, AND ELECTRONIC APPARATUS

BACKGROUND OF THE INVENTION

Field of the Invention

The present invention relates to a configuration of a mounting member in an electronic component.

Description of the Related Art

An electronic component in an electronic apparatus is an electronic device such as a semiconductor chip primarily mounted on a mounting member, and the electronic component is secondarily mounted on a wiring member such as a printed wiring board.

Such a mounting member includes a connecting portion (internal connecting portion) to be connected with an electronic device and a connecting portion (external connecting portion) to be connected with a wiring member. In an electronic component, an electronic device and the internal connecting portion is sealed to be packaged with a sealing member such as a resin such that the external connecting portion may be exposed.

Japanese Patent Laid-Open No. 2005-294343 discloses a light receiving integrated circuit apparatus in which a light receiving integrated circuit and a chip capacitor are mounted on a circuit substrate and are sealed with transparent resin.

A reduced distance between the internal connecting portion and the external connecting portion could reduce the size of the electronic component. The external connecting portion is spaced away from the sealing member as much as possible such that the sealing member may not cover the external connecting portion. This, however, may prevent the reduction of the size of the electronic component.

The present invention provides an electronic component having a reduced size.

SUMMARY OF THE INVENTION

An electronic component includes an electronic device, a mounting member configured to mount the electronic device and having a first connecting portion electrically coupled to the electronic device and a second connecting portion electrically coupled to outside, and a sealing member configured to cover the electronic device and the first connecting portion.

The mounting member includes a substrate having a mounting surface mounting the electronic device, a first conductive layer disposed on the mounting surface and a second conductive layer spaced apart from the first conductive layer in a first direction orthogonal to the mounting surface. The first conductive layer includes a first conductive pattern having the first connecting portion and a second conductive pattern having the second connecting portion and spaced apart from the first conductive pattern in a second direction along the mounting surface, and the second conductive pattern is connected to the first conductive pattern through a third conductive pattern included in the second conductive layer. The sealing member does not cover the second conductive pattern.

Further features of the present invention will become apparent from the following description of exemplary embodiments with reference to the attached drawings.

DESCRIPTION OF THE EMBODIMENTS

With reference to drawings, embodiments of the present invention will be described below. It should be noted that like numbers refer to like parts throughout. Thus, like parts will be described with cross reference to a plurality of drawings, and the description regarding parts referred to with like numbers will be omitted.

First Embodiment

Figure 1A:
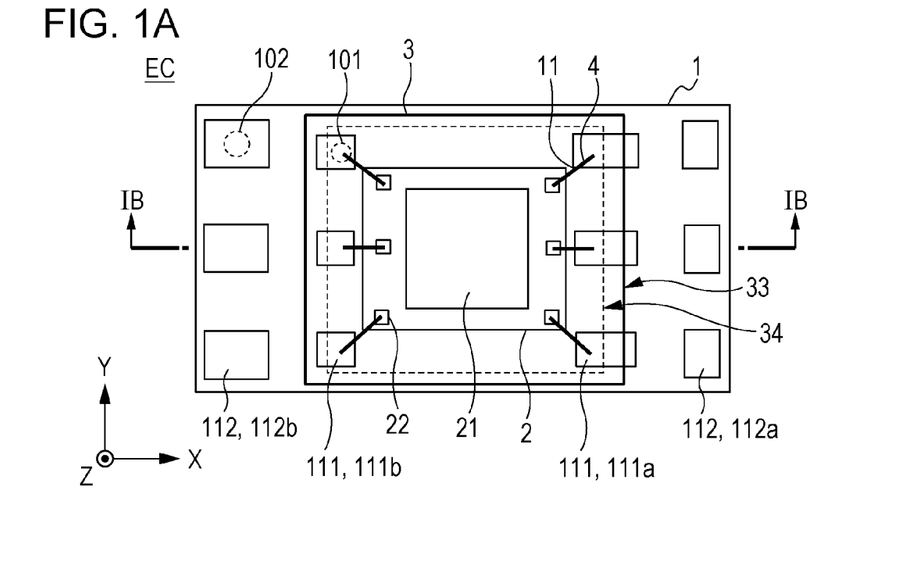
FIGS. 1A and 1B are schematic diagrams of an example of an electronic component.
Figure 1B:
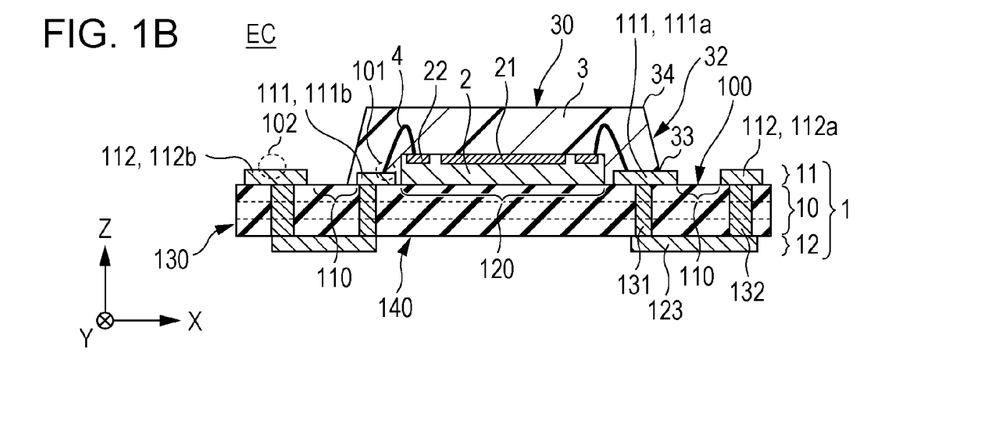

FIG. 1A is a schematic plan view in an X-Y direction of an electronic component EC according to a first embodiment, and FIG. 1B is a schematic section view in an X-Z direction taken at Line IA-IA in FIG. 1A. The electronic component EC includes a mounting member 1, an electronic device 2 and a sealing member 3.

The mounting member 1 has an internal connecting portion 101 (first connecting portion) electrically coupled to the electronic device 2 which is disposed in an inner region of the mounting member 1 and an external connecting portion 102 (second connecting portion) electrically coupled to the outside.

The mounting member 1 includes a substrate 10 having a mounting surface 100 on which the electronic device 2 is to be mounted, a first conductive layer 11 disposed on the mounting surface 100, and a second conductive layer 12. The second conductive layer 12 is spaced apart from the first conductive layer 11 in a direction (Z direction) orthogonal to the mounting surface 100. The X direction and Y direction are directions along the mounting surface 100, and the Z direction (second direction) is a direction orthogonal to the mounting surface 100. For example, the X direction and Y direction (second direction) are in parallel with the mounting surface 100, and the Z direction is perpendicular to the mounting surface 100. The X direction, Y direction, and Z direction could be orthogonal to each other, but the present invention is not limited thereto.

The substrate 10 is an insulating substrate containing a resin such as glass epoxy or ceramic and may be a rigid or flexible substrate. The substrate 10 has a single insulating layer or a plurality of insulating layers. FIG. 1B illustrates an example in which the substrate 10 has three insulating layers. The substrate 10 has the mounting surface 100 on a front surface side which is one principal surface and an opposite surface 140 on the back side which is the other principal surface. The mounting surface 100 and the opposite surface 140 extend to an end face 130. At least a part of the end face 130 includes the insulating layer of the substrate 10.

In a case where the mounting member 1 is of two-layer wiring, the first conductive layer 11 is provided on the mounting surface 100 (front surface) side while the second conductive layer 12 is provided on the opposite surface 140 (back surface) side. In a case where the mounting member 1 is of multi-layer wiring, the first conductive layer 11 is provided on the mounting surface 100 (front surface) side, and the second conductive layer 12 is provided between the back surface side and one of the front surface and the back surface, and a third conductive layer (not illustrated) is provided between the back surface side and the other one of the front surface and back surface. In this case, the conductive layer between the mounting surface 100 and the opposite surface 140 is sandwiched by a plurality of insulating layers included in the substrate 10. The front surface of the mounting member 1 may include the substrate 10 and the first conductive layer 11 or may include an insulating film (not illustrated), such as a solder resist, covering the substrate 10 and first conductive layer 11. Such an insulating film covering the first conductive layer 11 may cover at least one of a first conductive pattern 111 and a second conductive pattern 112 but is provided such that the insulating film may not cover at least the internal connecting portion 101 and external connecting portion 102. The insulating film covering the first conductive layer 11 could be positioned between the electronic device 2 and the substrate 10.

The first conductive layer 11 includes a plurality of conductive patterns including the first conductive pattern 111 and the second conductive pattern 112. The distances from the plurality of conductive patterns included in the first conductive layer 11 from the mounting surface 100 are equal to each other. The first conductive pattern 111 has at least a part of the internal connecting portion 101, and the second conductive pattern 112 has at least a part of the external connecting portion 102. The second conductive pattern 112 is spaced apart from the first conductive pattern 111 in a direction (X direction, Y direction) along the mounting surface 100. In other words, the first conductive pattern 111 and second conductive pattern 112 are conductive patterns independent from each other within the first conductive layer 11. The mounting surface 100 has a region covered by no conductive pattern which will be called a non-pattern region 110 between a region covered by the first conductive pattern 111 and a region covered by the second conductive pattern 112.

The second conductive layer 12 includes a plurality of conductive patterns including a third conductive pattern 123. The distances of the plurality of conductive patterns included in the second conductive layer 12 from the mounting surface 100 are equal to each other. Typically, the distance from each of the plurality of conductive patterns included in the second conductive layer 12 from the mounting surface 100 is larger than the distance from each of the plurality of conductive patterns included in the first conductive layer 11 from the mounting surface 100.

The first conductive pattern 111 is a primary mounting conductive pattern for connecting the conductive member 4 such as a bonding wire and a bump. The second conductive pattern 112 is a secondary mounting conductive pattern to be bonded by using a conductive member such as a solder or an anisotropic conductive material. Therefore, the surfaces of the conductive patterns may be plated with gold, palladium, tin, or bismuth, for example, in accordance with the applications or as required. The thicknesses of the conductive patterns included in the first conductive layer 11 may be in a range of 10 to 100 µm, for example, and may typically be in a range of 25 to 75 µm. As a result, the front surface of the mounting member 1 has concaves and convexes which differ in height from 10 to 100 µm in accordance with the differences in height of the upper surfaces of the conductive patterns between the non-pattern region 110 and the first conductive layer 11. Even in a case where the first conductive layer 11 is covered by an insulating film of solder resist, for example, the upper surface of the insulating film forming the front surface of the mounting member 1 may have concaves and convexes which differ in height from 10 to 100 µm.

The second conductive pattern 112 included in the first conductive layer 11 is connected to the first conductive pattern 111 included in the first conductive layer 11 through the third conductive pattern 123 included in the second conductive layer 12. In this embodiment, the first conductive pattern 111 is connected to the third conductive pattern 123 through a conductive portion 131 provided in a hole of the substrate 10. Also in this embodiment, the second conductive pattern 112 is connected to the third conductive pattern 123 through a conductive portion 132 provided in a hole of the substrate 10. Each of the conductive portions 131 and 132 may be provided in a film shape along an inner wall of a hole of the substrate 10 extending in the thickness direction (Z direction) of the substrate 10 or may fill the hole. The holes in which the conductive portions 131 and 132 are provided may extend through the substrate 10 or may extend through one insulating layer of the substrate 10 but not through another insulating layer.

In the mounting region 120 at the center of the mounting surface 100 of the mounting member 1, the electronic device 2 is fixed by using a bonding material (not illustrated) such as a die bond paste. The electronic device 2 may be a memory, a signal processing device, a light emitting device such as an LED and an LD, a display device such as a DMD and an LCOS, or a light receiving device such as a CCD sensor and a CMOS sensor. The light receiving device may be an image pickup device or a photodetector device. For example, the photodetector device may detect laser beams to be irradiated to a photoconductive drum and generate a horizontal synchronizing signal in a laser beam printer so that the main scanning of the laser beams could be started from one position for each sub scanning. Alternatively, the photodetector device may be arranged around a finder in a camera for detecting a change in brightness caused by a user's approach so that a display device therein may be turned off while a user is using the finder. In this way, the electronic component according to this embodiment may be mounted in an electronic apparatus such as a printer and a camera.

The electronic device 2 has a function part 21 including an integrated circuit and a terminal part 22 including an input/output electrode (pad). The mounting member 1 and the electronic device 2 are electrically coupled by the conductive member 4 such as a bonding wire and a bump. In this embodiment, the conductive member 4 being a bonding wire is bonded to the internal connecting portion 101 of the first conductive pattern 111 and the electrode in the terminal part 22. The internal connecting portion 101 is at least a part of the first conductive pattern 111 and is in contact with the conductive member 4.

In the aforementioned structure, the components from the electronic device 2 to the second conductive pattern 112 are electrically coupled. In other words, the electronic device 2 is connected to the outside through the terminal part 22, conductive member 4, first conductive pattern 111, conductive portion 131, third conductive pattern 123, conductive portion 132 and second conductive pattern 112.

Next, the sealing member 3 will be described. The sealing member 3 is provided on the upper first conductive layer 11 of the substrate 10, that is, on the mounting surface 100 and covers the electronic device 2 and internal connecting portion 101. The sealing member 3 is in contact with the front surface of the mounting member 2. The front surface of the mounting member 2 in contact with the sealing member 3 includes an insulating film such as a solder resist which covers the substrate 10, the conductive pattern of the first conductive layer 11, and/or the first conductive layer 11. The sealing member 3 has an upper surface 30 extending along the mounting surface 100 and a side surface 32 extending from the upper surface 30 to the mounting surface 100. An edge 33 in the X-Y direction of the sealing member 3 is a side (lower side) facing the mounting surface 100 of the side surface 32 of the sealing member 3. The upper surface 30 and the side surface 32 are continuous through an upper side 34. In this embodiment, the four sides of the edge 33 are all discontinuous with the end face 130 of the mounting member 1. In other words, the four sides of the edge 33 are spaced apart from the end face 130, and the mounting surface 100 is exposed without being covered by the sealing member 3 between the edge 33 and the end face 130.

The sealing member 3 may be colored or colorless or may be transparent or opaque. However, in a case where the electronic device 2 is a light emitting device or a light receiving device, a transparent resin or preferably a colorless, transparent resin such as epoxy, acrylic, or silicone resin may be selected therefor. Such a resin may be photo-curing or thermosetting, but a thermosetting resin may be advantageous for higher resin processibility. The method for forming the resin is not limited particularly but potting, printing, molding or any other method may be applicable. Molding particularly may allow easy formation of a flat surface of the sealing member 3 and thus advantageously allow reduction of the size and thickness of the apparatus.

The sealing member 3 in this embodiment may cover at least a part of the electronic device 2 and first conductive pattern 111. Particularly, a first conductive pattern 111a which is illustrated as a first example of the first conductive pattern 111 in FIGS. 1A and 1B has a region covered by the sealing member 3 and a region not covered by the sealing member 3. In other words, the edge 33 of the sealing member 3 overlaps the first conductive pattern 111a in the Z direction. A first conductive pattern 111b which is illustrated as a second example of the first conductive pattern 111 in FIGS. 1A and 1B is entirely covered by the sealing member 3. In other words, the edge 33 overlaps the non-pattern region 110 between the first conductive pattern 111b and the second conductive pattern 112, and the edge 33 of the sealing member 3 does not overlap the first conductive pattern 111b in the Z direction. The sealing member 3 could be in contact with the conductive member 4 bonded to the internal connecting portion 101 and the terminal part 22 of the electronic device 2. When a flip-chip connection method is applied, the sealing member 3 may not be in contact with the conductive member 4.

On the other hand, the sealing member 3 does not cover the second conductive pattern 112. Thus, the edge 33 of the sealing member 3 does not overlap the second conductive pattern 112 in the Z direction. The sealing member 3 does not cover the second conductive pattern 112 spaced apart from the first conductive pattern 111 so that the size of the electronic component EC could be reduced. This is because the sealing member 3 is spaced apart from the second conductive pattern 112, and the distance between the sealing member 3 and the external connecting portion 102 could therefore be reduced.

Figure 1C:
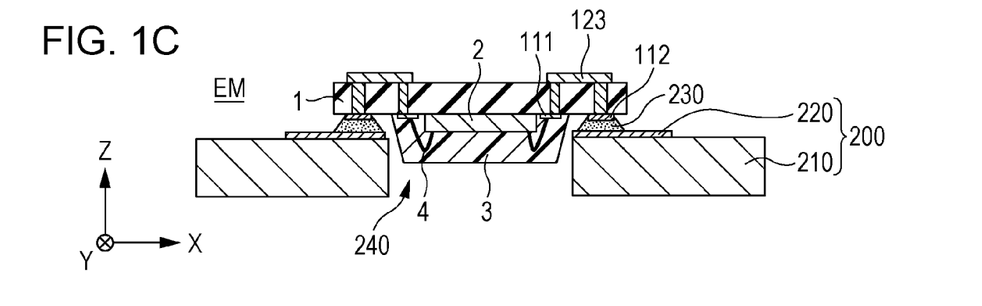
FIG. 1C is a schematic diagram of an example of an electronic module.

FIG. 1C is a schematic cross section view of an electronic module EM including the electronic component EC according to the first embodiment and a wiring member 200. The wiring member 200 has a substrate 210 and an electrode 220. The wiring member 200 may be a printed wiring board. The substrate 210 may be a rigid substrate or a flexible substrate. The electrode 220 and the external connecting portion 102 are bonded with each other through a conductive member 230 such as a solder or an anisotropic conductive material. The external connecting portion 102 may be at least a part of the second conductive pattern 112 and be in contact with the conductive member 230. In this embodiment, the substrate 210 has an opening 240, and the electrode 220 is provided around the opening 240. The sealing member 3 positions within the opening 240 and is surrounded by the wiring member 200. The opening 240 has an O-shaped or U-shaped inner wall. The sealing member 3 of the electronic component EC is fitted into the opening 240 of the wiring member 200. In a case where the electronic device 2 is a light emitting device or a light receiving device, light enters or is emitted through the opening 240.

The electronic module EM having this structure could have a reduced thickness. This is because the thickness of the sealing member 3 of the thickness of the electronic component EC could also be provided by the thickness of the wiring member 200. In other words, the thickness of the electronic module EM could be smaller than the sum of the thickness of the electronic component EC and the thickness of the wiring member 200 by a thickness equivalent to the thickness of the sealing member 3 (strictly speaking, the thickness of the part positioning in the opening 240 of the sealing member 3).

The side surface 31 of the sealing member 3 may tilt against the mounting surface 100 as illustrated in FIG. 1B for improved productivity. This is because, when the electronic component EC is mounted to the wiring member 200, the electronic component EC may be arranged such that the tilting side surface 31 slides on an inner edge of the opening 240 and that the sealing member 3 of the electronic component EC may be positioned about the opening 240 in a self-aligned manner. It should be noted that, in the electronic module EM, a sealing member different from the sealing member 3 may be formed so as to cover the second conductive pattern 112 and thus protect the electronic component EC.

Second Embodiment

Figure 2A:
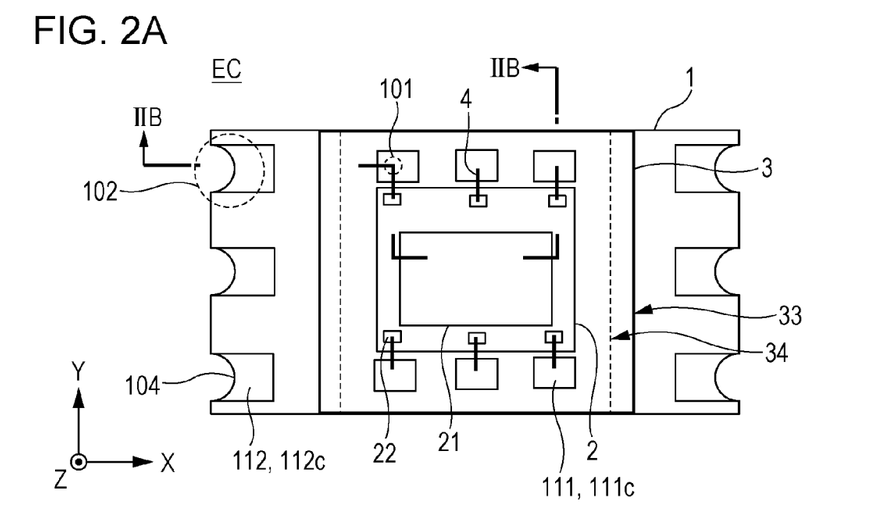
FIGS. 2A and 2B are schematic diagrams of an example of an electronic component.
Figure 2B:
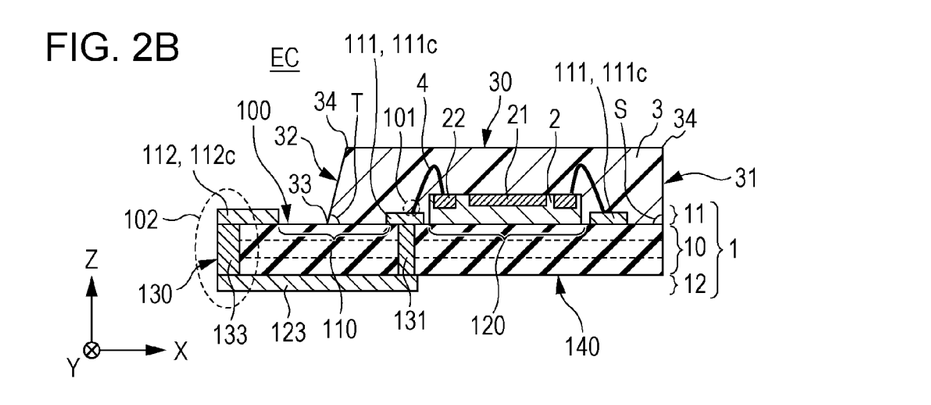

FIG. 2A is a schematic plan view of an electronic component EC according to a second embodiment, and FIG. 2B is a schematic cross section view taken at Line IIB-IIB in FIG. 2A. Only differences from the electronic component EC according to the first embodiment will be described below. The same matters as those of the first embodiment will not be mentioned below.

As illustrated in FIGS. 2A and 2B, a plurality of first conductive patterns 111 each having the internal connecting portion 101 are all covered by the sealing member 3, and a plurality of second conductive patterns 112 each having the external connecting portion 102 are not covered by the sealing member 3. The edge 33 of the sealing member 3 does not overlap a conductive pattern included in the first conductive layer 11 in the Z direction. In other words, the edge 33 does not reside on any conductive pattern of the plurality of conductive patterns included in the first conductive layer 11, and the edge 33 resides only on the non-pattern region 110.

According to this embodiment, one of pairs of two facing sides of four sides of the edge 33 is discontinuous with the end face 130 of the mounting member 1. In other words, two sides of the edge 33 are spaced apart from the end face 130.

The mounting surface 100 is not covered by the sealing member 3 and thus is exposed between the edge 33 and the end face 130. On the other hand, the other pair of two facing sides of the four sides of the edge 33 is continuous with the end face 130 of the mounting member 1. In other words, the two sides of the edge 33 are matched with an edge of the end face 130, and the mounting surface 100 is not exposed between the edge 33 and the end face 130.

The sealing member 3 has a side surface 31 and a side surface 32. According to this embodiment, the side surface 32 has sides of the one pair, and the side surface 31 has sides of the other pair. Assume that the angle close to the sealing member 3 of the side surface 31 against the mounting surface 100 is an angle S and that the angle close to the sealing member 3 of the side surface 32 against the mounting surface 100 is an angle T. Further assume that the angle T is smaller than the angle S. The side surface 32 tilts against the mounting surface 100, and the angle T may be in a range of 60 to 85 degrees, and the angle S may be in a range of 85 to 95 degrees. The internal connecting portion 101 (first conductive pattern 111 and conductive member 4) positions between the electronic device 2 and the side surface 31 in the X-Y direction, and the side surface 32 positions between the electronic device 2 and the external connecting portion 102 (second conductive pattern 112) in the X-Y direction. The angle S larger than the angle T could reduce the distance from the internal connecting portion 101 to the end face 130 and could reduce the distance from the external connecting portion 102 to the electronic device 2 so that the size of the electronic component EC could be reduced.

According to the second embodiment, the second conductive pattern 112 is coupled to the third conductive pattern 123 through the conductive portion 133 provided in the end face 130 of the substrate 10. According to this embodiment, the conductive portion 133 is disposed along a concave of the end face 130. Referring to FIG. 2A, the end face 130 has semicylindrical concaves in a plan view. Instead of the end face 130 having such concaves, the conductive portion 133 and the insulating layer of the substrate 10 may form a flat end face 130. The surface of the conductive portion 133 may be plated like the second conductive pattern 112c.

Figure 2C:
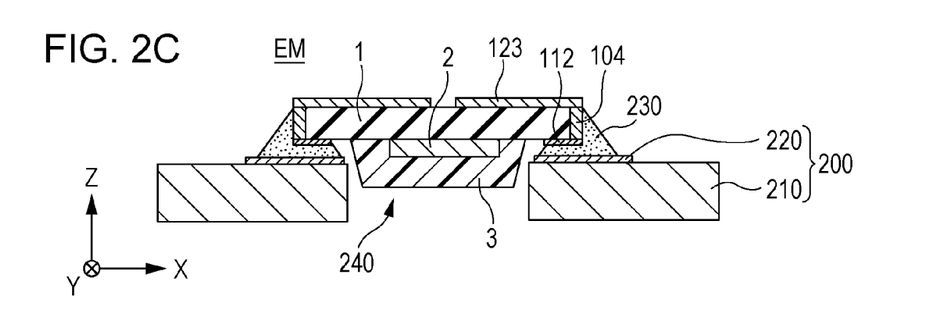
FIG. 2C is a schematic diagram of an example of an electronic module.

FIG. 2C is a schematic cross section view of an electronic module EM including the electronic component EC according to the second embodiment and the wiring member 200. The conductive member 230 to be bonded to the electrode 220 is in contact with not only the second conductive pattern 112 but also the conductive portion 133 of the end face 130. Thus, in a case a solder is used as the conductive member 230, a solid solder joint with improved reliability can be achieved therein. The conductive portion 133 arranged along the concaves could increase the area of the solder joint more than the flat conductive portion 133. Thus, stronger solder joints could be achieved with improved reliability.

Third Embodiment

Next, a manufacturing method for an electronic component EC according to the present invention will be described with reference to FIGS. 3A to 3D.

Figure 3A:
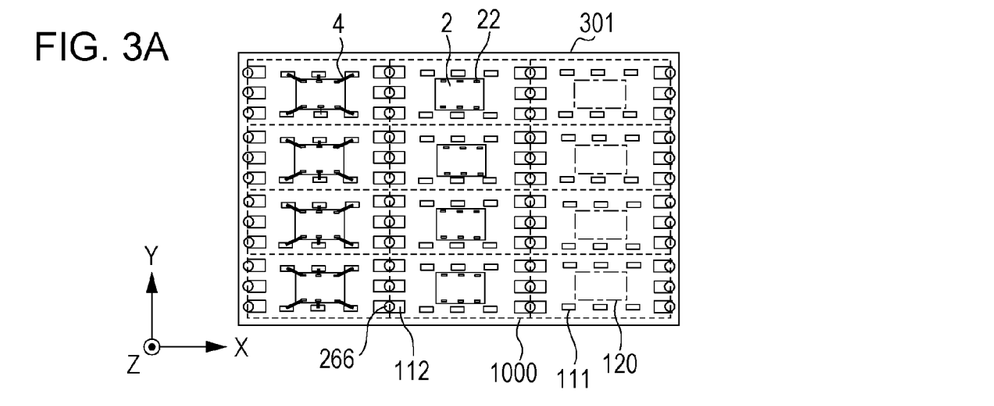
FIGS. 3A to 3D are schematic diagrams of an example of a manufacturing method for an electronic component.
Figure 3B:
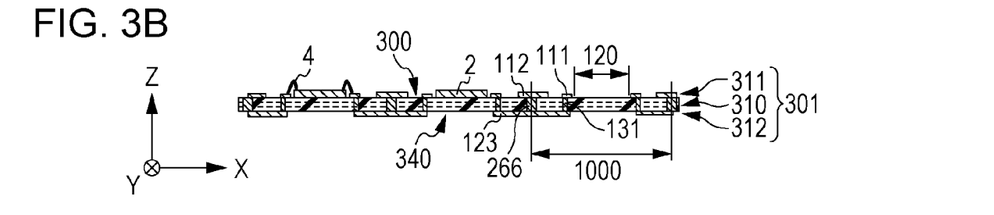

FIGS. 3A and 3B are used for describing a process for installing the electronic devices 2 on a mounting board 301. FIG. 3A illustrates a plan view of the electronic devices 2 on the mounting board 301, and FIG. 3B illustrates a cross-section view thereof.

The mounting board 301 has a substrate 310, a first conductive layer 311 disposed on a front surface 300 of the substrate 310, and a second conductive layer 312 disposed on a back surface 340. The plan view in FIG. 3A is a view from the front surface 300 side. It should be noted that though the second conductive layer 312 forms the back surface 340 of the mounting board 301, the mounting board 301 may be a multi-layered wiring board internally provided in the mounting board 301.

The mounting board 301 has repetitive conductive patterns each for one block 1000 indicated in a broken frame in FIG. 3A. Here, 4×3=12 blocks are provided. A plurality of mounting regions 120 are aligned in a grid on the front surface 300 of the substrate 310. The mounting regions 120 are allocated to each of the blocks 1000. A first conductive pattern 111 including the first conductive layer 311 and a second conductive pattern 112 including the second conductive layer 312 is disposed around each of the plurality of mounting regions 120. The second conductive pattern 112 is spaced apart from the first conductive pattern 111. The non-pattern region 110 is disposed between the first conductive pattern 111 and the second conductive pattern 112. Within the first conductive layer 311, the first conductive pattern 111 and the second conductive pattern 112 are isolated from each other.

The second conductive pattern 112 is electrically coupled to the first conductive pattern 111 through a third conductive pattern 123 including the second conductive layer 312. The first conductive pattern 111 is electrically coupled to the third conductive pattern 123 through the conductive portion 131 positioning within holes of the mounting board 301. The second conductive pattern 112 is electrically coupled to the third conductive pattern 123 through conductors 266 positioning within holes of the mounting board 301. Each of the conductors has a columnar or tubular shape.

The plurality of electronic devices 2 are arranged on the mounting board 301. Each of the plurality of electronic devices 2 is fixed to one of the plurality of mounting regions 120 through a die bond material (not illustrated). Each of the electronic devices 2 has its terminal part 22 connected to the first conductive pattern 111 through a conductive member 4 (bonding wire) by wire bonding. The first conductive pattern 111 may extend on the mounting regions 120, and the terminal parts 22 of the electronic devices 2 may be connected to the first conductive pattern 111 through the conductive member 4 (bumps) by a flip-chip method.

Figure 3C:
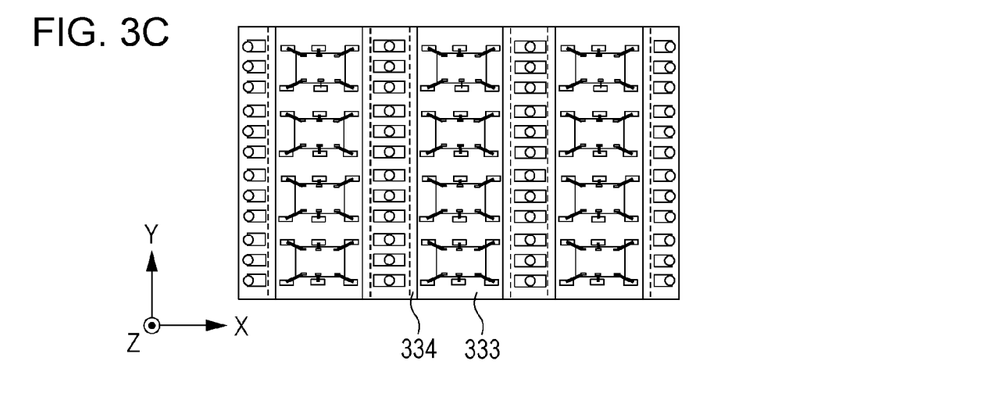
Figure 3D:
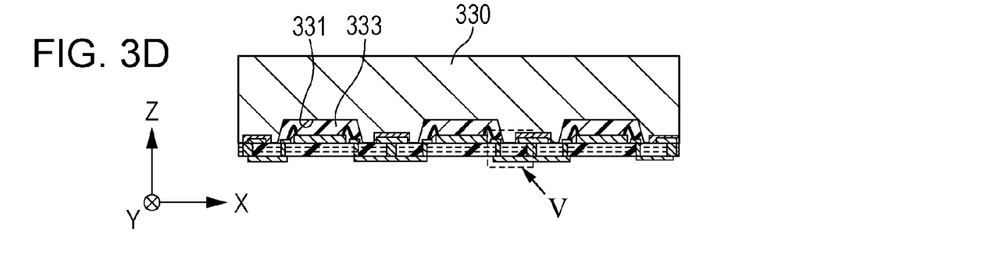
Figure 5:
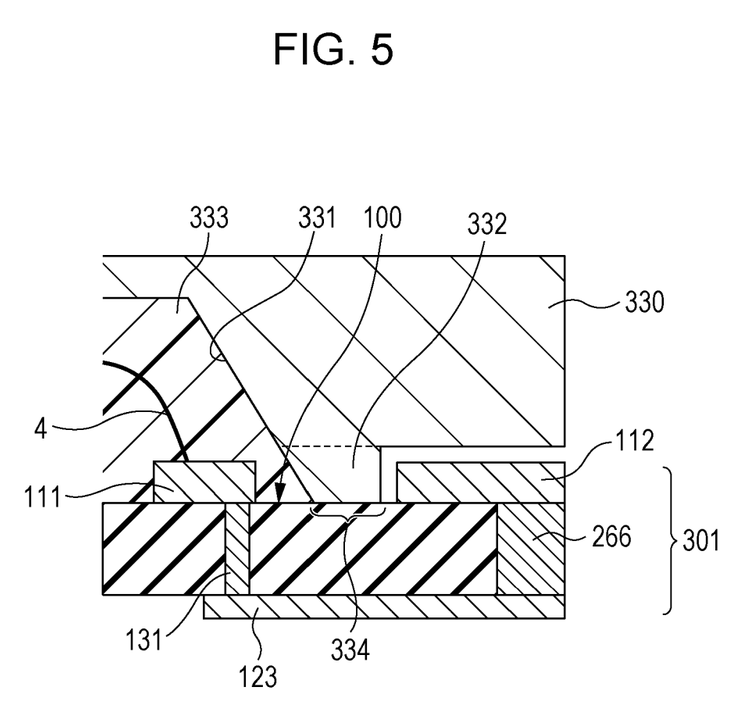
FIG. 5 is a schematic diagram of an example of a manufacturing method for an electronic component.

FIGS. 3C and 3D are used for describing a process for forming a resin body 333 covering the electronic devices 2 on the mounting board 301. FIG. 3C is a plan view, and FIG. 3D is a cross section view. FIG. 5 illustrates an enlarged view of a region V in FIG. 3D. The method for forming the resin body 333 is not limited particularly, but potting, printing, molding or any other method may be applicable. Molding particularly may allow easy formation of a flat surface of the sealing member 3 and thus allows the size and thickness of the apparatus could be reduced advantageously. In this embodiment, a transfer molding method is applied for forming the resin body 333. FIG. 3D illustrates a state that the mounting board 301 on which the electronic devices 2 are fixed is set to a die 330 for transfer molding. The transfer molding method includes sandwiching the mounting board 301 by an upper die having a concave 331 and a lower die and then pouring a resin into a space surrounded by the concave 331 of the upper die. FIG. 3D illustrates the die 330 as the upper die. The die 330 has a convex 332, and the convex 332 is formed so as to abutted against a part 334 between the electronic device 2 and the external connecting portion 102 in the flat non-pattern region 110 between the first conductive pattern 111 and the second conductive pattern 112 in the X-Y direction on the mounting surface of the mounting board 301. Therefore, when the die 330 is disposed, the space surrounded by the concave 331 may be isolated from an exterior space by the convex 332. Thus, when the resin poured into the space surrounded by the concave 331 may be prevented from leaking from the space having the first conductive pattern 111 toward the second conductive pattern 112 and from attaching to the second conductive pattern 112. Because the molding surface of the concave 331 of the die 330 tilts, the side surface of the resin body 333 also tilts. The tilted surface positions between the second conductive pattern 112 and the electronic device 2 in this embodiment. This tilting structure could enhance the mold release property. For easy separation between the die 330 and the resin body 333, a mold release sheet may be placed on the molding surface of the die 330.

In this embodiment, the concaves 331 continuously surround the plurality of electronic devices 2, resulting in a series of resin bodies 333 continuously covering the plurality of electronic device 2. However, the die 330 may have concaves 331 each surrounds one of the plurality of electronic devices 2 so that the plurality of resin bodies 333 individually cover the plurality of electronic devices 2. In this case, the die 330 having one concave 331 only may be moved for each group of the plurality of electronic devices 2, or the die 330 may have a plurality of concaves 331.

Figure 4A:
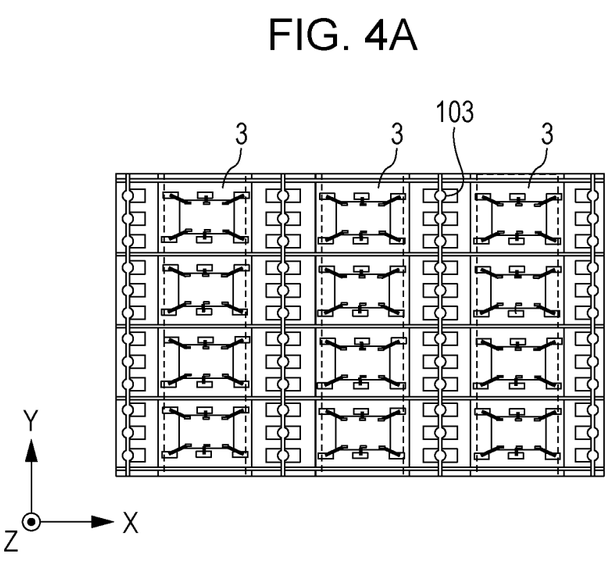
FIGS. 4A and 4B are schematic diagrams of an example of a manufacturing method for an electronic component.
Figure 4B:
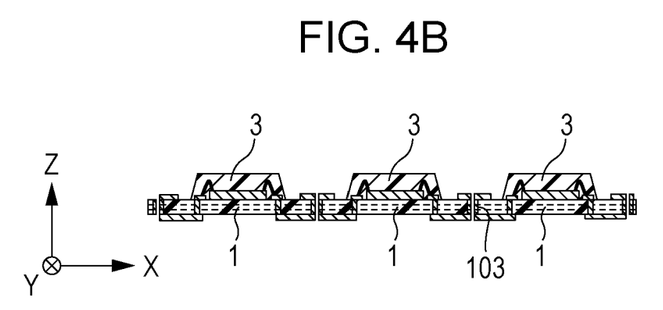

FIGS. 4A and 4B are used for describing a process for dividing the mounting board 301 into a plurality of divisions. FIG. 4A is a plan view, and FIG. 4B is a cross section view thereof. The mounting board 301 may be divided by cutting by blade dicing or laser dicing along boundaries of the blocks 1000 illustrated in FIG. 3A. This process results in a plurality of electronic components EC. Each of the plurality of electronic components EC has a sealing member 3 as a part of the resin body 333, a mounting member 1 as a part of the mounting board 301, and at least one of the plurality of electronic devices.

As in this embodiment, in a case where a series of resin bodies 333 continuously covers the plurality of electronic devices 2, the dividing results in each of the sealing members 3 having a cut end. In this embodiment, the first conductive pattern 111 and the conductive member 4 formed by wire bonding are configured to position between the cut ends of the resin bodies 333 formed by the dividing the mounting board 301 and the electronic devices 2. Each of the cut ends and each of the tilting surfaces form side surfaces of the conductive member 4. The angle of the cut end close to the sealing member 3 against the front surface 300 (first side surface) is larger than the angle of the tilting surface (second side surface) close to the sealing member 3 against the front surface 300.

In this embodiment, dividing the mounting board 301 also divides the conductor 266 into a plurality of pieces. Thus, a semicircular (concave-shaped) conductive portion 133 is formed on a side surface of the mounting member 1 of the electronic component EC having divided into pieces. By dividing the conductor 266 provided in one hole, the conductive portions 133 may be efficiently provided on the end faces 130 for a plurality of mounting members 1.

Comparison Example

Figure 6A:
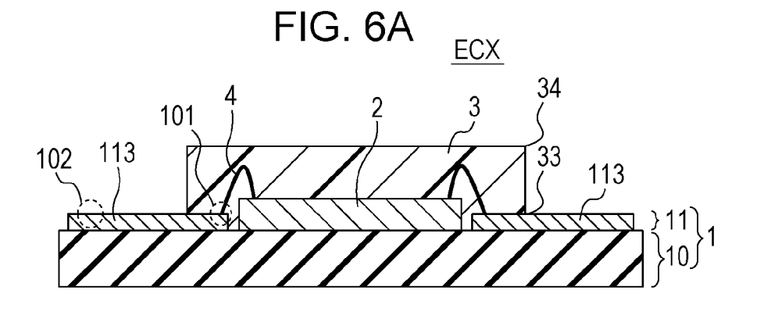
FIGS. 6A to 6C are schematic diagrams of a comparison example of an electronic component.
Figure 6B:
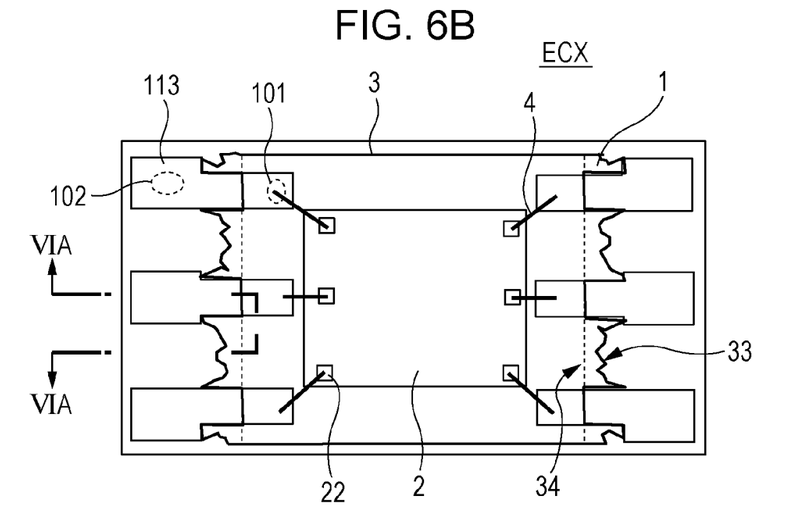
Figure 6C:
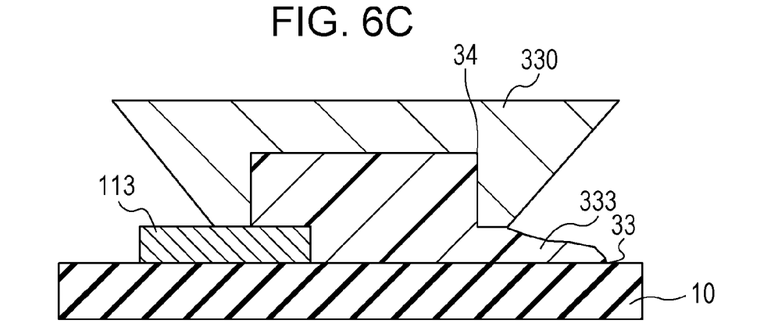

FIGS. 6A and 6B illustrate an electronic component ECX according to a comparison example. FIG. 6A is a schematic cross section view taken at Line VIA-VIA in FIG. 6B. As illustrated in FIGS. 6A and 6B, in the electronic component ECX, both of the internal connecting portions 101 and the external connecting portions 102 are provided on a common conductive pattern 113. The sealing member 3 covers the internal connecting portions 101 and covers a part of the conductive pattern 113 such that the external connecting portions 102 could be exposed. Providing the internal connecting portions 101 and the external connecting portions 102 on the common conductive pattern 113 may cause a liquid resin to be the sealing member 3 to spread along the conductive pattern 113, as illustrated in FIG. 6B, resulting in an increased area of the sealing member 3 in the surface direction. Therefore, the resin may spread to the external connecting portions 102 necessary for soldering, which makes a stable solder joint therein difficult. In order to prevent the sealing member 3 from covering the external connecting portions 102 during a manufacturing process, a need arises for forming the sealing member 3 sufficiently far away from the external connecting portions 102. As a result, reduction of the size of the mounting member 1 could not be achieved. The spread of the sealing member 3 may occur in a general scheme for forming a resin body, such as printing, potting and molding. As described above, the thickness of the conductive pattern of the first conductive layer 11 is appropriately in a range of 10 to 100 μm. Therefore, the surface of the mounting member 1 has concaves and convexes differing in height by 10 μm or more in accordance with the distribution of the conductive pattern. A resin may possibly flow into concaves functioning as a flow path between convexes corresponding to the conductive pattern of the first conductive layer 11. Applying molding may more easily inhibit the spread of the sealing member 3 than printing and potting. However, as illustrated in FIG. 6C, in a case where the die 330 is abutted against the conductive pattern 113, a gap corresponding to the thickness of the conductive pattern 113 may possibly occur between the mounting board 301 and the die 330. The leakage of the resin body 333 from the gap may expand the sealing member 3, which therefore enlarges the edge 33. In a case where a gap of 10 μm or larger occurs between the mounting board 301 and the die 330, the leakage of the resin from the gap is a realistic problem. As described according to the third embodiment, the die 330 is abutted against the non-pattern region 110 formed by providing the second conductive pattern 112 far away from the first conductive pattern 111 so that the leakage can be reduced.

It is to be understood that changes, modifications and alterations may be made to the aforementioned embodiments without departing from the scope and spirit of the present invention.

According to the present invention, the size of an electronic component may be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-226086, filed Nov. 6, 2014, which is hereby incorporated by reference herein in its entirety.

What is claimed is:

1. An electronic component comprising an electronic device, a mounting member configured to mount the electronic device and having a first connecting portion electrically coupled to the electronic device and a second connecting portion electrically coupled to outside, and a sealing member configured to cover the electronic device and the first connecting portion, wherein the mounting member includes:
a substrate having a mounting surface mounting the electronic device,
a first conductive layer disposed on the mounting surface, and
a second conductive layer spaced apart from the first conductive layer in a first direction orthogonal to the mounting surface,
wherein the first conductive layer includes:
a first conductive pattern having the first connecting portion, and
a second conductive pattern having the second connecting portion and spaced apart from the first conductive pattern in a second direction along the mounting surface, the second conductive pattern is connected to the first conductive pattern through a third conductive pattern included in the second conductive layer, and
wherein the sealing member does not cover the second conductive pattern,
wherein the sealing member has an upper surface along the mounting surface, a first side surface extending from the upper surface toward the mounting surface and has a first angle close to the sealing member against the mounting surface and a second side surface extending from the upper surface toward the mounting surface and having a second angle close to the sealing member against the mounting surface, the second angle being smaller than the first angle; and
wherein the first connecting portion positions between the electronic device and the first side surface and/or between the electronic device and the second side surface in the second direction, and the second side surface positions between the electronic device and the second connecting portion in the second direction.

2. The electronic component according to claim 1, wherein an edge of the sealing member in the second direction does not overlap the first conductive pattern in the first direction.

3. The electronic component according to claim 1, wherein an edge of the sealing member in the second direction does not overlap a conductive pattern included in the first conductive layer in the first direction.

4. The electronic component according to claim 1, wherein the second conductive pattern is connected to the third conductive pattern through a conductive portion disposed on an end face of the substrate.

5. The electronic component according to claim 4, wherein the end face of the substrate has concaves, and the conductive portion is disposed along concaves of the end face.

6. The electronic component according to claim 1, wherein the first conductive pattern is connected to the third conductive pattern through a conductor disposed in a hole of the substrate.

7. The electronic component according to claim 1, wherein the sealing member is a thermosetting transparent resin, and the sealing member is in contact with a conductive member bonded to the first connecting portion and a terminal part of the electronic device.

8. The electronic component according to claim 1, further comprising an bonding wire which is bonded to a terminal part of the electronic device and the first connection portion, wherein the sealing member is in contact with the bonding wire.

9. An electronic module comprising:
a wiring member having a terminal; and
the electronic component according to claim 1,
wherein the second connecting portion is solder-jointed to the terminal.

10. The electronic module according to claim 9, wherein the wiring member has an opening, the terminal is arranged around the opening, and the sealing member positions within the opening.

11. An electronic apparatus mounting the electronic component according to claim 1, wherein the electronic device is a light receiving device.

12. A method for manufacturing the electronic component according to claim 1,
the method comprising:
disposing a plurality of electronic devices including an electronic device on a mounting board;
forming a resin body on the mounting board, the resin body covering the plurality of electronic devices continuously or individually; and
dividing at least the mounting board into a plurality of pieces to acquire a plurality of electronic components such that each of the electronic components includes the sealing member as a part of the resin body, the mounting member as a part of the mounting board, and at least one of the plurality of electronic devices.

13. The method according to claim 12, further comprising molding the resin body by transfer molding by using a die, wherein the die is abutted against a region between the first conductive pattern and the second conductive pattern in the second direction on the mounting surface.

14. The method according to claim 13, further comprising:
connecting the electronic devices and the mounting board by wire bonding,
wherein the molding the resin body includes forming the resin body covers the plurality of electronic devices continuously; and
the acquiring the plurality of electronic components is performed such that a conductive member formed by the wire bonding could position between a cut end of the resin body formed by the dividing the mounting board and the electronic device.

15. A method for manufacturing the electronic component according to claim 4,
the method comprising:
disposing a plurality of electronic devices including the electronic device on a mounting board;
forming a resin body on the mounting board, the resin body covering the plurality of electronic devices continuously or individually; and
dividing at least the mounting board into a plurality of pieces to acquire a plurality of electronic components such that each of the electronic components includes the sealing member as a part of the resin body, the mounting member as a part of the mounting board, and at least one of the plurality of electronic devices,
wherein a conductor disposed within a hole of the mounting board is divided into a plurality of pieces by the dividing the mounting board to form the conductive portion as a part of the conductor.

* * * * *